United States Patent
Amo et al.

(10) Patent No.: US 9,559,267 B2
(45) Date of Patent: Jan. 31, 2017

(54) LIGHT-EMITTING DEVICE

(71) Applicant: NICHIA CORPORATION, Anan-shi, Tokushima (JP)

(72) Inventors: Takahiro Amo, Anan (JP); Eiji Tokunaga, Komatsushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/952,013

(22) Filed: Nov. 25, 2015

(65) Prior Publication Data

US 2016/0155905 A1    Jun. 2, 2016

(30) Foreign Application Priority Data

Nov. 29, 2014    (JP) .................................. 2014-242652

(51) Int. Cl.
| | |
|---|---|
| *H01L 33/60* | (2010.01) |
| *H01L 33/48* | (2010.01) |
| *H01L 33/62* | (2010.01) |
| *H01L 33/52* | (2010.01) |
| *H01L 33/50* | (2010.01) |

(52) U.S. Cl.
CPC ............. *H01L 33/483* (2013.01); *H01L 33/50* (2013.01); *H01L 33/52* (2013.01); *H01L 33/60* (2013.01); *H01L 33/62* (2013.01)

(58) Field of Classification Search
CPC ........ H01L 33/507; H01L 33/52; H01L 33/54; H01L 33/60; H01L 33/647; H01L 31/0203
See application file for complete search history.

(56) References Cited

U.S. PATENT DOCUMENTS

| | | | |
|---|---|---|---|
| 2011/0031509 A1* | 2/2011 | Kirihara | ..................... F21S 4/20 |
| | | | 257/81 |
| 2011/0291154 A1* | 12/2011 | Noichi | .................. H01L 33/486 |
| | | | 257/99 |
| 2012/0061706 A1 | 3/2012 | Kamada | |

(Continued)

FOREIGN PATENT DOCUMENTS

| | | |
|---|---|---|
| JP | 2010-199487 A | 9/2010 |
| JP | 2012-080085 A | 4/2012 |

(Continued)

*Primary Examiner* — Pamela E Perkins
(74) *Attorney, Agent, or Firm* — Foley & Lardner LLP (57) ABSTRACT

A light-emitting device includes a support body having a quadrangle planar shape, a wiring pattern on the support body, a light-emitting element on the wiring pattern, a recognition target portion on a corner portion of the support body, the recognition target portion including a conductive material, an insulation layer reflecting light emitted from the light-emitting element and covering a periphery of the recognition target portion, and a light-transmissive member including a lens portion covering the light-emitting element and a flange portion on a periphery of the lens portion and covering a portion of the recognition target portion that is covered with the insulation layer. The portion of the recognition target portion covered by the flange portion is arranged in a non-point symmetry around a center of the support body, and a difference in reflectivity between the support body and the insulation layer is larger than between the support body and the recognition target portion.

17 Claims, 4 Drawing Sheets (56) References Cited

U.S. PATENT DOCUMENTS

| | | |
|---|---|---|
| 2012/0193665 A1 | 8/2012 | Yamada |
| 2012/0248483 A1 | 10/2012 | Beppu et al. |
| 2014/0042478 A1* | 2/2014 | Hirono .................... H01L 33/54 |
| | | 257/98 |
| 2014/0209953 A1 | 7/2014 | Kamada |
| 2014/0346548 A1 | 11/2014 | Beppu et al. |

FOREIGN PATENT DOCUMENTS

| | | |
|---|---|---|
| JP | 2012-089728 A | 5/2012 |
| JP | 2012-156442 A | 8/2012 |
| JP | 2012-256848 A | 12/2012 |
| JP | 2014-036047 A | 2/2014 |
| WO | WO-2012/057038 A1 | 5/2012 |

\* cited by examiner

LIGHT-EMITTING DEVICE

CROSS-REFERENCE TO RELATED APPLICATION

The present application claims priority to Japanese Patent Application No. 2014-242652, filed on Nov. 29, 2014, which is incorporated by reference in its entirety.

BACKGROUND

1. Field of the Invention

The present invention relates to a light-emitting device.

2. Description of Related Art

There have been known light-emitting devices that include a mark utilized for various purposes and disposed on a surface of a substrate (see Patent Literature 1: Japanese Unexamined Patent Application Publication No. 2010-199487). In Patent literature 1, the mark is formed apart from a light-emitting element on the surface of the substrate. For example, the mark is used when a shift in the position of the light-emitting element or a shift in the position of a lens-like sealing unit for sealing the light-emitting element is inspected, or when light-emitting modules array made of a plurality of light-emitting modules is divided into each module. As one of such light-emitting devices with aforementioned mark, a light-emitting module including the mark integrally formed with feeder patterns (wiring patterns) is proposed. See Patent Literature 2: WO 2012/057038.

In Patent Literature 2, however, the mark of the light-emitting module is made of the same material as that of the feeder patterns (in other words, wiring patterns). Accordingly, in a case where a difference in reflectivity between the substrate and the feeder patterns (in other words, wiring patterns) is small, the difference between the substrate and the mark in reflectivity is also small. And thus, with such a combination of the substrate and the feeder patterns, the mark may not be recognized during visual recognition or digital recognition, even if other aspect of the combination such as heat-dissipation and sulfur resistance is good.

SUMMARY

A light-emitting device includes a support body, a wiring pattern on the support body, a light-emitting element on the wiring pattern, a recognition target portion formed of a conductive material on the support body, an insulation layer configured to reflect light emitted from the light-emitting element, and a light transmissive unit configured to include a lens portion for covering the light-emitting element and a flange portion arranged on a periphery of the lens portion and covering the recognition target portion, and the insulation layer covers at least a periphery of the recognition target portion, and a difference in reflectivity between the support body and the insulation layer is larger than a difference in reflectivity between the support body and the recognition target portion.

According to embodiments of the invention, the difference in reflectivity between the support body and the insulation layer is larger than the difference in reflectivity between the support body and the recognition target portion, which increases the contrast ratio of the support body to an area where the recognition target portion exists, so that the position of the recognition target portion can be recognized easily independent of the difference in reflectivity between the support body and the wiring pattern. Accordingly, even in a case where a difference in reflectivity between the support body and the wiring patterns is small, various kinds of processing with visual recognitions or digital recognitions such as inspection, mounting and division can be smoothly performed through the use of the insulation layer that covers the recognition target portion. Therefore, it is possible to select combinations of the support body and the wiring patterns in which the difference in reflectivity between the support body and the wiring patterns is small while other aspect such as heat-dissipation and sulfur resistance is good.

DETAILED DESCRIPTION OF EMBODIMENTS

Light-Emitting Device 100 According to First Embodiment

Figure 1:
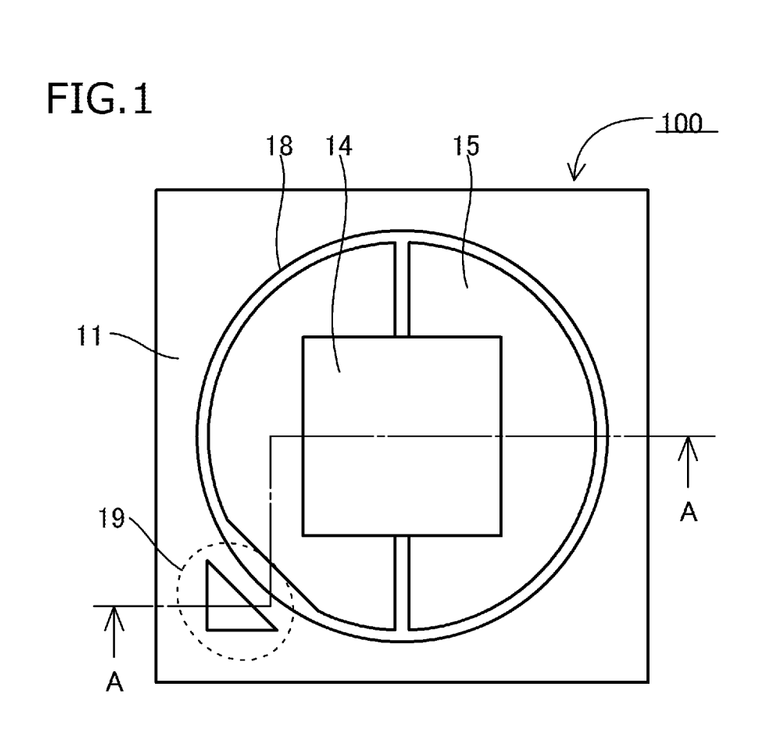
FIG. 1 is a schematic plan view of a light-emitting device according to a first embodiment.
Figure 2:
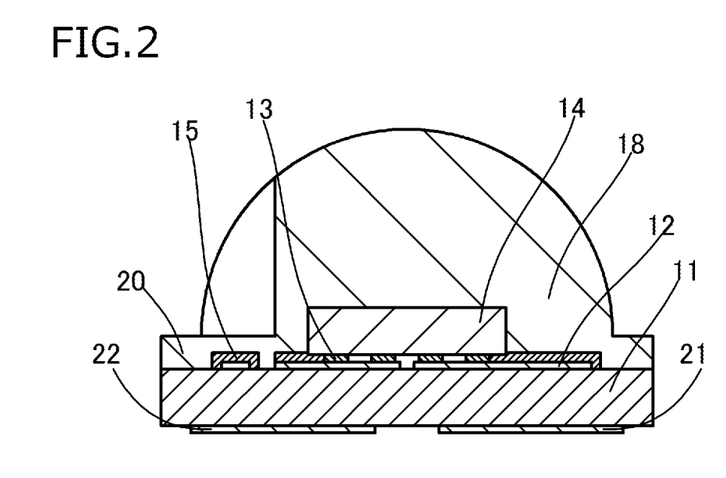
FIG. 2 is a schematic view illustrating a cross section taken along the line A-A of FIG. 1.

FIG. 1 is a schematic plan view of a light-emitting device according to a first embodiment. FIG. 2 is a schematic view illustrating a cross section taken along the line A-A of FIG. 1. As illustrated in FIGS. 1 and 2, a light-emitting device 100 according to the first embodiment includes a support body 11, a wiring pattern 12 on the support body 11, a light-emitting element 14 on the wiring pattern 12, a recognition target portion 19 formed of an electrically-conductive material on the support body 11, an insulation layer 15 that reflects light emitted from the light-emitting element 14, a light transmissive member that includes a lens portion 18 covering the light-emitting element 14 and a flange portion 20 arranged on the periphery of the lens portion 18 and covering the recognition target portion 19, and the insulation layer 15 covers at least a periphery of the recognition target portion 19, and a difference in reflectivity (which means a reflectivity at the peak wavelength of light emitted to the support body 11 and the insulation layer 15 in the case of conducting visual recognition or digital recognition) between the support body 11 and the insulation layer 15 is larger than a difference in reflectivity between the support body 11 and the recognition target portion 19. Hereinafter, the light-emitting device 100 will be described in detail.

Support Body 11

The support body 11 is a member for arranging electronic components such as the light-emitting element 14 and a protective element 17 (see FIG. 3 described later) thereon. The support body 11 can have any appropriate shape, but, is preferable of a shape with a flat upper surface such as a rectangular plate. The support body 11 is a member having insulation properties and comprises, preferably, ceramics such as alumina and aluminum nitride, glass epoxy resin and thermoplastic resin. According to the present embodiment, the position of the recognition target portion 19 can be identified, independent of the difference in reflectivity between the support body 11 and the wiring pattern 12. Therefore, the support body 11 can be made of a material in which a difference in reflectivity with respect to the wiring pattern 12 is small while other aspect such as heat-dissipation and sulfur resistance is good.

Wiring Pattern 12

The wiring pattern 12 is a member formed on the support body 11, and electrically connects the light-emitting element 14 arranged on the support body 11 to an external power source, and is used to apply voltage from the external power source to the light-emitting element 14.

The light-emitting element 14 is disposed on the wiring pattern 12. It is preferable that the wiring pattern 12 be disposed in a wide area in the periphery of the light-emitting element 14 in such a manner that heat generated by the light-emitting element 14 is efficiently dissipated via the wiring pattern 12. It is noted that a phosphor layer 16 (see FIGS. 3 and 4 described later) or the insulation layer 15 may be formed on the surface of the wiring pattern 12 in the periphery of the light-emitting element 14, for example, by an electrodeposition method.

The wiring pattern 12 comprises a conductive material, and preferably comprises materials that are physically and chemically stable, have high conductivity, and have good heat dissipation. The wiring pattern 12 can comprise, for example, metal such as Au (gold), Ag (silver), Cu (copper), aluminum, tungsten, iron, nickel or alloy such as iron-nickel alloy and phosphor bronze. Preferably, the surface of the wiring pattern 12 is covered by materials having high reflectivity (that is, light-reflectivity with respect to the peak wavelength of light emitted from the light-emitting element 14), such as Au (gold) and Ag (silver). According to the present embodiment, the position of the recognition target portion 19 can be identified, independent of the difference in reflectivity between the support body 11 and the wiring pattern 12, so that the wiring pattern 12 can comprise materials in which a difference in reflectivity with respect to the wiring pattern 12 is small while other aspect such as heat-dissipation and sulfur resistance is good.

The wiring pattern 12 can have any appropriate thickness, but a larger thickness is preferable than a smaller thickness in order to enhance heat dissipation. Specifically, it is preferable that the thickness of the wiring pattern 12 is approximately in a range of 5 to 80 μm.

As illustrated in FIG. 1, the wiring pattern 12 and the recognition target portion 19 may be formed apart from each other. This arrangement allows to easily cover only the recognition target portion 19 by the insulation layer 15. A distance of separation is not particularly limited, but preferably 0.05 mm or more. However, in the case where the wiring pattern 12 and the recognition target portion 19 are formed apart from each other, and the insulation layer 15 is formed by the electrodeposition method described later, the wiring pattern 12 and the recognition target portion 19 are connected to each other in the interior of the support body 11 or on the back surface of the support body 11.

Light-Emitting Element 14

The light-emitting element 14 is disposed on the wiring pattern 12 formed on the support body 11. It is preferable that a light-emitting diode is employed for the light-emitting element 14. The light-emitting diode is, preferably, a stacked structure including a light-emitting layer on a growth substrate. Examples of the material for the stacked structure include various semiconductors, for example, nitride semiconductors such as InN, AlN, GaN, InGaN, AlGaN, and InGaAlN, III-V group compound semiconductors, and II-VI group compound semiconductors. As the growth substrate, insulation substrates such as sapphire or electrically-conductive substrates such as SiC, GaN, and GaAs can be employed. The light-emitting element 14 includes electrodes at positions on an inner side with respect to the periphery of the light-emitting element 14. The shape of the electrodes of the light-emitting element 14 is not particularly limited, and the electrodes can be formed in various shapes such as an approximately rectangle or circle. The materials of the electrodes of the light-emitting element 14 are not particularly limited. The number of light-emitting elements 14 disposed on the wiring pattern 12 is not particularly limited and may be single or plural.

Bonding Member 13

A bonding member 13 is a member for bonding the light-emitting element 14 to the wiring pattern 12 formed on the support body 11. The bonding member 13 can be arranged in such a manner as to be interposed at least between the electrodes of the light-emitting element 14 and the wiring pattern 12. For the bonding member 13, materials that conduct electricity between the light-emitting element 14 and the wiring pattern 12 are employed. For example, the bonding member 13 can be solder materials such as Sn—Cu, Sn—Ag—Cu, and Au—Sn, metal bumps such as Au, and anisotropic electrically-conductive paste.

Recognition Target Portion 19

The recognition target portion 19 is formed of an electrically-conductive material on the support body 11. Since the recognition target portion 19 comprises the electrically-conductive material, the recognition target portion 19 can be easily covered by the insulation layer 15 by using the electrodeposition. It is preferable that the recognition target portion 19 is completely covered with the insulation layer 15, but a portion of the recognition target portion 19 may be exposed from the insulation layer 15.

Preferably, the recognition target portion 19 is a part of the wiring pattern 12, that is, integrally formed with the wiring pattern 12. Thus, the recognition target portion 19 and the wiring pattern 12 can be formed simultaneously.

The number of recognition target portion 19 can be appropriately determined, and either a single recognition target portion 19 or a plurality of recognition target portions 19 can be arranged according to the purpose of the recognition. The recognition target portion may have any appropriate shape such as a circular shape, a triangular shape, an L-shape, and a T-shape, that allows visual recognition or digital recognition of the recognition target portion 19. The more complicated the shape of the recognition target portion 19 becomes, the higher the recognizability is enhanced. Whereas in the case where the shape of the recognition target portion 19 is excessively complicated, the recognition target portion 19 may not easily be formed. Accordingly, in the case where the easiness of formation is intended to be enhanced, the shape of the recognition target portion 19 is preferably formed with minimum required complexity. In the case where the recognizability is intended to be enhanced, the shape of the recognition target portion 19 is preferably formed with high complexity to the extent that it is not too hard to form the recognition target portion 19. Although not particularly limited, in the case where the recognition target portion 19 is formed in a shape having eight sides or more, recognizability of the recognition target portion 19 can be improved.

Use of the recognition target portion 19 is not particularly limited, and the recognition target portion 19 can be utilized, for example, when shifts in the position of the light-emitting element 14 or light transmissive member are inspected, when the light-emitting modules array is divided in units of modules, or when the polarities of electrode terminals described below are distinguished.

The position of the recognition target portion 19 is not particularly limited, but preferably is on a corner portion, that is, in an area in close proximity of a corner inclusive of the corner of the support body 11. In this way, in the case where the recognition target portion 19 serves as a cathode mark, it can be easy to recognize the polarity of the light-emitting device 100 based on the direction of the support body 11. The cathode mark is a mark for distinguishing an electrode terminal 22 of a negative electrode from an electrode terminal 21 of a positive electrode in a plan view of the light-emitting device 100. It is noted that it only needs to distinguish the electrode terminals, and the cathode mark is not necessarily formed in a region closer to the electrode terminal 22 of a negative electrode. In the case where material having a rectangular shape in the plan view serves as the support body 11, the lens member 18 is often formed in a central portion of the support body 11, which easily secures a space in which the recognition target portion 19 is arranged on the corner portion of the support body 11.

Figure 3:
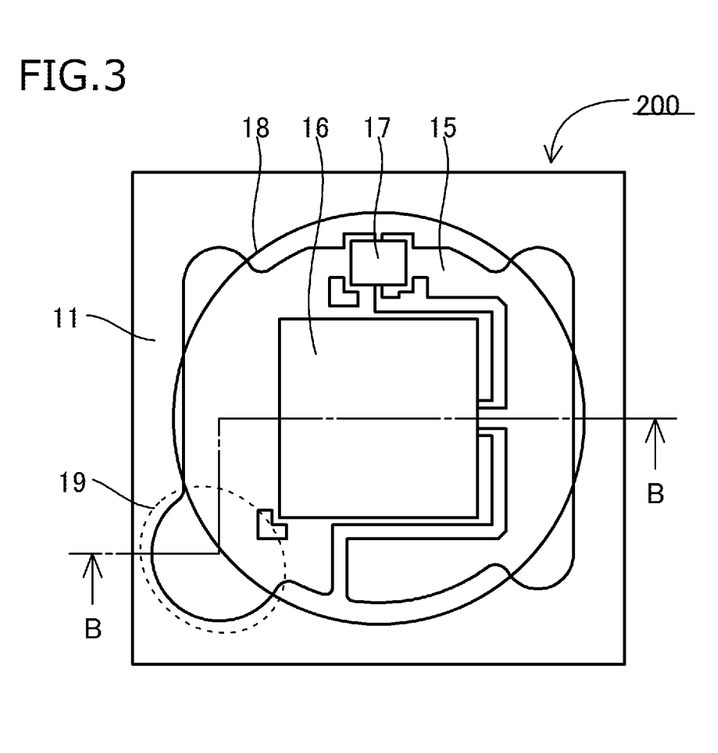
FIG. 3 is a schematic plan view of a light-emitting device according to a second embodiment.

The recognition target portion 19 can be arranged appropriately, but a non-point symmetry arrangement around a center of the support body 11 as shown in FIG. 1 and FIG. 3 is preferable. In this manner, a shape of the light-emitting device 100, when viewed from above, is seen to be different from, for example, a shape of the light-emitting device 100 when viewed from above after rotating at 180 degrees, specifically with respect to a location of the recognition target portion 19. Accordingly, in the case where the recognition target portion 19 serves as the cathode mark, the polarity of the light-emitting device 100 can be recognized based on the direction of the light-emitting device 100 (support body 11). Rotating the light-emitting device 100 (or rotating the support body 11) at 180 degrees means inverting the shape prior to the rotation horizontally and vertically. The recognition target portion 19 is preferably, arranged on one of four corner portions of the support body 11, for example, as illustrated in FIG. 1.

Insulation Layer 15

The insulation layer 15 is made of a material in which a difference in reflectivity between the support body 11 and the insulation layer 15 is larger than a difference in reflectivity between the support body 11 and the recognition target portion 19. Specifically, in the case where the support body 11 comprises at least one of alumina, aluminum nitride, mullite, glass epoxy, and epoxy resin, and the recognition target portion 19 is made of Au (gold) and Cu (copper), which can be the same material as that of the wiring pattern 12, it is preferable that the insulation layer 15 comprises, for example, at least one of titanium dioxide, silicon dioxide, zirconia, potassium titanate, alumina, aluminum nitride, boron nitride, mullite, niobium oxide, zinc oxide, barium sulfate, and various rare earth oxides. For the insulation layer 15, it is preferable to use a material which allows a 30% or more difference in reflectivity between the support body 11 and the insulation layer 15 at the peak wavelength of the light emitted to the support body 11 and the insulation layer 15 during visual recognition or digital recognition. Further, a 40% or more difference in reflectivity is more preferable. In this manner, even in the case where the difference between the reflectivity of the support body 11 and the reflectivity of the insulation layer 15 varies due to a difference in environments during the visual recognition or digital recognition (e.g., in the case where the reflectivity of the support body 11 ranges from 10 to 30%, and the reflectivity of the insulation layer 15 ranges from 40 to 70%), the difference between the reflectivity of the support body 11 and the reflectivity of the insulation layer 15 can be sufficiently secured (that is, at least a 10% difference in reflectivity is secured in the case of the aforementioned example). Accordingly, the position of the recognition target portion 19 can be easily identified in a variety of environments.

Figure 4:
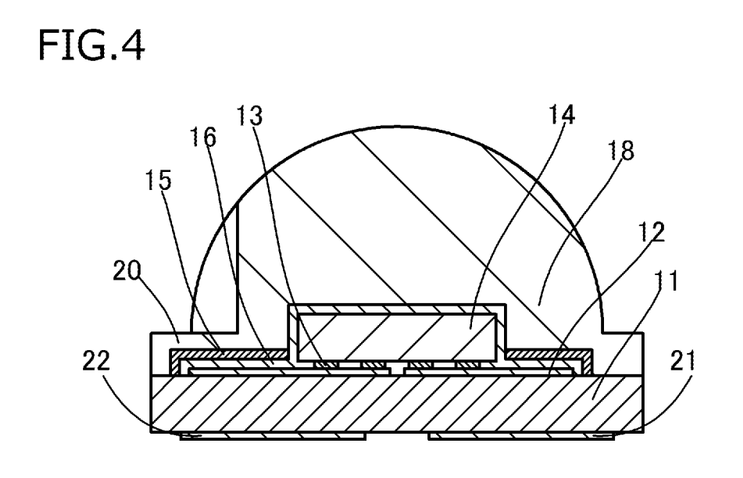
FIG. 4 is a schematic view illustrating a cross section taken along the line B-B of FIG. 3.

The insulation layer 15 reflects a light emitted from the light-emitting element 14. Specifically, the insulation layer 15 reflects 50% or more of the light emitted from the light-emitting element 14 at the peak wavelength without being excited by the light emitted from the light-emitting element 14. This allows to prevent the light from absorbed too much by the insulation layer 15. Although not particularly limited, it is preferable that the reflectivity of the insulation layer 15 (i.e. the reflectivity with respect to the peak wavelength of the light emitted from the light-emitting element 14) is higher than the reflectivity of the recognition target portion 19 (i.e. the reflectivity with respect to the peak wavelength of the light emitted from the light-emitting element 14) in order to improve the output of the light-emitting device 100. As illustrated in FIGS. 3 and 4 described below, in the case where the wiring pattern 12 that surrounds the recognition target portion 19 and the light-emitting element 14 are covered by the phosphor layer 16, a portion of the phosphor layer 16 is preferably covered by the insulation layer 15 so as to reduce color unevenness attributed to the phosphor layer 16.

The insulation layer 15 covers at least a periphery of the recognition target portion 19, and preferably covers the entire area of the recognition target portion 19. Because at least a periphery of the recognition target portion 19 is covered with the insulation layer 15, the position of the recognition target portion 19 can be easily identified.

Light Transmissive Member

The light transmissive member includes the lens portion 18 covering the light-emitting element 14, and the flange portion 20 arranged on the periphery of the lens portion 18 and covering at least a part of the recognition target portion 19. Covering the light-emitting element 14 by the lens portion 18 allows for protecting the light-emitting element 14 from an external environment. Also, covering the recognition target portion 19 by the flange portion 20 allows for protecting the recognition target portion 19 from the external environment. The lens portion 18 includes a curved surface that condenses the light emitted from the light-emitting element 14. On the other hand, in the case where the flange portion 20 includes a curved surface or an irregularity, the visual appearance of the insulation layer 15 that covers the recognition target portion 19 easily changes due to the difference in environments during visual recognition or digital recognition. The flange portion 20 is preferably formed in a flat shape in order to reduce difference in visual appearance due to a difference in environments during the visual recognition or digital recognition of the insulation layer 15 that covers the recognition target portion 19. It is noted that the lens portion 18 may or may not cover a portion of the recognition target portion 19.

The light transmissive member is formed with a material that transmits a light emitted from the light-emitting element 14, and specifically formed with a material that transmits 60% or more of the light emitted from the light-emitting element 14, and preferably a material that transmits 70% or more of the light, and more preferably a material that transmits 80% or more of the light, and further preferably a material that transmits 90% or more of the light. Examples of such materials having high light transmissiveness include resin, such as silicone resin, silicone modified resin, epoxy resin, phenol resin, polycarbonate resin, acrylic resin, trimethylpentene resin, polynorbornene resin, or hybrid resin that includes one or more of the aforementioned resins.

As described above, according to the light-emitting device 100 of the first embodiment, the difference in reflectivity between the support body 11 and the insulation layer 15 is larger than the difference in reflectivity between the support body 11 and the recognition target portion 19, which increases the contrast ratio of the support body 11 to an area where the recognition target portion 19 is disposed, so that the position of the recognition target portion 19 can be identified independent of the difference in reflectivity between the support body 11 and the wiring pattern 12. Accordingly, even in a case where a difference in reflectivity between the support body and the wiring patterns is small, various kinds of processing with visual recognitions or digital recognitions such as inspection, mounting and division can be smoothly performed through the use of the insulation layer that covers the recognition target portion. Therefore, it is possible to select combinations of the support body and the wiring patterns in which the difference in reflectivity between the support body and the wiring patterns is small while other aspect such as heat-dissipation and sulfur resistance is good.

Although not particularly limited, the light-emitting device 100 according to the first embodiment is particularly suitable for the case where the input of digital recognition is in monochrome. In this case, recognition cannot be based on difference of colors, so that the difference in reflectivity between the support body 11 and the area where the recognition target portion 19 exists, in other words, the contrast ratio of the support body 11 to the area where the recognition target portion 19 exists becomes important.

Light-Emitting Device 200 According to Second Embodiment

FIG. 3 is a schematic plan view of a light-emitting device 200 according to the second embodiment, and FIG. 4 is a schematic view illustrating a cross section taken along the line B-B of FIG. 3. As illustrated in FIGS. 3 and 4, the light-emitting device 200 according to the second embodiment is different from the light-emitting device 100 according to the first embodiment in that the light-emitting device 200 comprises the protective element 17 in addition to the phosphor layer 16. Hereinafter, the description will focus on a difference between the first and second embodiments.

Although the recognition target portion 19 and the wiring pattern 12 may be formed apart from each other as seen in the light-emitting device 100 of the first embodiment, they may be integrally formed as seen in the light-emitting device 200 of the second embodiment. Also, as illustrated in FIG. 3, in the case where the wiring pattern 12 includes extensions that extends toward the four corner portions, one of the extensions of the wiring pattern 12 may have a further-extending portion that further extends in a direction from the lens portion 18 toward the flange portion 20 relative to other three corner portions, so that the further-extending portion of the one extension can serve as the recognition target portion 19. The length of the further-extending portion of the wiring pattern 12, which can serve as the recognition target portion 19, from the lens portion 18 to an outermost edge of the further extending portion, is not particularly limited, but is preferably 0.3 mm or more in order to facilitate visual recognition.

Phosphor Layer 16

The phosphor layer 16 includes a fluorescent substance that can be excited by the light emitted from the light-emitting element 14 to emit light with wavelength different from that of the light emitted from the light-emitting element 14. The phosphor layer 16 converts the wavelength of the light emitted from the light-emitting element 14 into a different wavelength. The phosphor layer 16 may convert the wavelength of the light emitted from the light-emitting element 14 into a shorter wavelength, but preferably converts the wavelength of the light emitted from the light-emitting element 14 into a longer wavelength in terms of light extraction efficiency of the light emitting device.

The phosphor layer 16 can be disposed in such a manner as to cover at least the upper surface and lateral surfaces of the light-emitting element 14. This allows the refractive index of the phosphor layer 16 to be larger than the refractive index of the light transmissive member disposed in the periphery of the light-emitting element 14, so that the total reflection of the light on the upper surface and the lateral surface of the light-emitting element 14 can be suppressed. Accordingly, this can reduce the light confined in the light-emitting element 14 due to the total reflection, and the absorption of the light in the light-emitting element 14 can be reduced. Furthermore, the phosphor layer 16 may be arranged in such a manner as to cover the recognition target portion 19 or a portion of the wiring pattern 12 located laterally outside a periphery of the light-emitting element 14 in a plan view. It is preferable that the phosphor layer 16 covering the recognition target portion 19 or the wiring pattern 12 located laterally outside the periphery of the light-emitting element 14 is covered by the insulation layer 15 in order to suppress the phosphor layer 16 causing a color unevenness of light emitted from the light emitting device.

Preferably, the phosphor layer 16 is formed with a uniform thickness. This allows to suppress the phosphor layer 16 causing a color unevenness. The term "uniform thickness" includes an approximately uniform thickness. Although the specific thickness of the phosphor layer 16 is not particularly limited, preferably, the thickness is in a range of 0.1 to 100 μm.

As fluorescent substances included in the phosphor layer 16, for example, a combination of one, two or more of any of the substances described below can be used.

The following substances mainly activated by lanthanoids such as Eu and Ce: nitride-based phosphor, oxynitride-based phosphor, and sialon-based phosphor.

The following substances mainly activated by lanthanoids such as Eu and transition metal elements such as Mn: alkali earth halogen apatite phosphor, alkali earth metal boric acid halogen phosphor, alkali earth metal aluminate phosphor, alkali earth silicate phosphor, alkali earth sulfide phosphor, alkali earth thiogallate phosphor, alkali earth silicon nitride phosphor, and germanate phosphor.

The following substances mainly activated by lanthanoids such as Ce: rare-earth aluminate phosphor and rare-earth silicate phosphor.

Organic phosphor or phosphor such as organic complex mainly activated by lanthanoids such as Eu.

Although the shape of the phosphor is not particularly limited, it is preferable that the shape is formed, for example, in a sphere or a form similar to a sphere. Specifically, it is more preferable that the phosphor has a shape having average grain diameter in a range of 0.1 to 100 μm, and more preferably, average grain diameters in a range of 1 to 10 μm.

Protective Element 17

The protective element 17 is disposed on the wiring pattern 12. As the protective element 17, for example, a Zener diode can be used. It is preferable that the protective element 17 is covered by the insulation layer 15 so that an absorption of a light from the light-emitting element 14 can be reduced by the protective element 17.

Manufacturing Method of Light-Emitting Device 100 According to First Embodiment

Next, the manufacturing method of the light-emitting device 100 according to the first embodiment will be described.

First Step

First, the support body 11 on which the wiring pattern 12 is arranged is provided. In the case where the recognition target portion 19 is not a part of the wiring pattern 12, the support body 11 on which the wiring pattern 12 and the recognition target portion 19 are arranged is provided.

Second Step

Second, the light-emitting element 14 is disposed on the wiring pattern 12, and the light-emitting element 14 is bonded to the wiring pattern 12 by the bonding member 13. A method of the bonding can be appropriately selected in accordance with a type of the bonding member 13. For example, the bonding method can be ultrasonic waves, heat, load, light, and using flux. The wiring pattern 12 includes a portion exposed without being bonded to the light-emitting element 14 in the periphery of the light-emitting element 14. In the case where solder materials are used as the bonding member 13, the exposed wiring pattern 12 can spread surplus solder materials that are not used to bond the light-emitting element 14. That is, the surplus solder materials transfer from below the light-emitting element 14 to the exposed wiring pattern 12 side and is bonded to the exposed wiring pattern 12. Accordingly, forming the exposed wiring pattern 12 with sufficient area allows the light-emitting element 14 to be bonded to the wiring pattern 12 with a proper amount of solder, and the failure of bonding the light-emitting element 14 to the wiring pattern 12 due to the excessive amount of solder can be reduced.

Third Step

Third, the insulation layer 15 is formed on at least the outer periphery of the recognition target portion 19 on the support body 11. Methods for forming the insulation layer 15 are exemplified by (A) a sputtering method, (B) an evaporation method, (C) a sedimentation method, (D) a potting method, (E) a printing method, (F) an electrodeposition method, and (G) an electrostatic coating. According to the methods (A) and (B), the insulation layer 15 can be attached to the light-emitting element 14 and the whole of the support body 11 without using a binder. According to the methods (C), (D) and (E), the insulation layer 15 can be selectively formed over the support body 11 by using resin in which an insulating substance is dispersed. Also, according to the methods (F) and (G), a portion of the support body 11 where the insulating substance is intended to be attached comprises a conductive material, so that the insulation layer 15 can be selectively formed over the support body 11. The methods (F) and (G) are preferable among the methods (A) to (G) because the methods (F) and (G) allows the insulation layer 15 to be formed with more uniform thickness. And that is also because the methods (F) and (G) can reduce shifts in the position due to the uneven thickness of the insulation layer 15 and thus can improve the accuracy in specifying the position of the recognition target portion 19. In the case of the electrodeposition method (F), the insulation layer 15 may be formed, for example, by arranging the support body 11 on which the light-emitting element 14 is mounted in a solution such as solution for electro deposition that includes particles having insulation property, and by depositing the particles on the wiring pattern 12 that includes the recognition target portion 19 of the support body 11 by electrophoresis in the solution. However, if the insulation layer 15 is formed on a surface of the light-emitting element 14, it may be difficult to extract the light. Accordingly, in the case where the surface of the light-emitting element 14 has a surface having conductivity, the surface of the light-emitting element 14 is coated with an insulating member (an insulating member different from the insulating substance that comprises the insulation layer 15) in advance so that the insulating substance comprising the insulation layer 15 is not attached to a surface of the light-emitting element 14. It is noted that a thickness of the insulation layer 15 can be appropriately adjusted based on the conditions of depositing the insulating particles or the deposition period.

Fourth Step

Subsequently, the light transmissive member is formed. The light transmissive member includes the lens portion 18 and the flange portion 20. The lens portion 18 covers the light-emitting element 14. The flange portion 20 covers the recognition target portion that is provided on the periphery of the lens portion 18. Known methods can be employed for the formation of the lens portion 18. For example, in the case where the light transmissive member is made of resin, the lens portion 18 can be formed by compression molding.

Manufacturing Method of Light-Emitting Device 200 According to Second Embodiment The manufacturing method of the light-emitting device 200 according to the second embodiment of the present invention will be described below.

First Step

First, the support body 11 on which the wiring pattern 12 is arranged is provided. Similarly to the manufacturing method according to the first embodiment, in the case where the recognition target portion 19 is not a part of the wiring pattern 12, the support body 11 on which the wiring pattern 12 and the recognition target portion 19 are arranged is provided.

Second Step

Next, the light-emitting element 14 is disposed on the wiring pattern 12, and the light-emitting element 14 is bonded to the wiring pattern 12 by the bonding member 13. A method of the bonding is similar to that of the manufacturing method according to the first embodiment, and therefore the description is omitted.

Third Step

Subsequently, the phosphor layer 16 is formed on the support body 11 as to cover the light-emitting element 14. The phosphor layer 16 is formed at least on a surface of the light-emitting element 14 and on the wiring pattern 12 that is exposed in the periphery of the light-emitting element 14. As a method of forming the phosphor layer 16, the same method as that of forming the insulation layer 15 described in the manufacturing method according to the first embodiment can be employed. The methods (F) and (G) are preferable as well as in forming the insulation layer 15.

However, in forming the phosphor layer 16 by the electrodeposition method (F), different from in forming the insulation layer 15 by the electrodeposition method (F), phosphor particles are deposited on the surface of the light-emitting element 14 and the wiring pattern 12 of the support body 11. In the case where the surface of the light-emitting element 14 is made of materials having conductivity, the phosphor particles may be deposited on the surface of the light-emitting element 14, for example, by applying voltage to the light-emitting element 14 itself. In such a manner, the charged phosphor particles have the electrophoresis and are deposited on the surface of the light-emitting element 14.

In the case where the light-emitting element 14 that includes an insulating substrate such as sapphire is used as a growth substrate, the surface of the light-emitting element 14 includes a non-conductive portion (a portion comprising, for example, the growth substrate). Accordingly, even if the voltage is applied to the light-emitting element 14 itself, the phosphor particles cannot be deposited on the non-conductive portion. However, in such a case, for example, by forming a coating layer having conductivity on the non-conductive portion, and by applying the voltage to the coating layer, it becomes possible that the phosphor particles is deposited on the non-conductive portion. The coating layer having conductivity that is disposed on the non-conductive portion is removed or reformed to have the insulating property so as not to form the insulation layer 15 on the surface of the light-emitting element 14 after this step. As examples of removing or reforming the coating layer, the following methods (1) to (3) can be exemplified.

(1) After the formation of the phosphor layer 16, a material for selectively dissolving the material of the coating layer is injected in the solution for electrodeposition. In this manner, the solution for electrodeposition is used as acid solution (e.g. hydrochloric acid or sulfuric acid) or alkali solution (e.g. sodium hydroxide or ammonia) to dissolve and remove the coating layer.

(2) After the phosphor layer 16 is formed, the support body 11 with the light emitting element 14 is taken out from the solution for electrodeposition, and the coating layer is impregnated into solution such as acid solution (e.g. hydrochloric acid or sulfuric acid) or alkali solution (e.g. sodium hydroxide or ammonia) which dissolves and removes the coating layer.

(3) After the phosphor layer 16 is formed, the property of the coating layer is reformed into the insulation property by performing oxidation treatment.

Herein, in the cases (1) and (2) described above, it is preferable that the coating layer comprises Al or Zn. Also, in the case of (3) described above, it is preferable that the coating layer comprises Mg, Al, Si, Zr, or Pb because the property of the coating layer is reformed into not only insulating but also into light transmissiveness (in particular, high light transmissiveness). The thickness of the coating layer may have such a thickness that the treatment mentioned above can be made, and for example the thickness may be within a range of 100 Å to 10000 Å.

In the case where the growth substrate of the light-emitting element 14 has conductivity, forming an insulating coating layer on the phosphor layer 16 after the formation of the phosphor layer 16 allows to prevent the insulation layer 15 from being formed on the light-emitting element 14. The materials of the coating layer in this case can be exemplified by oxides such as AlxOy (1<x, 1<y) and SiOx (1<x) or by organic materials such as polymethyl methacrylate, polyimide, and silicone resin, as one example.

Fourth Step

Subsequently, the insulation layer 15 is formed on the recognition target portion 19 and on the periphery of the light-emitting element 14. The method of forming the insulation layer 15 is similar to that of the manufacturing method according to the first embodiment, and therefore its description is omitted.

Fifth Step

Next, the light transmissive member, which includes the lens portion 18 covering the light-emitting element 14 and the flange portion 20 arranged on the periphery of the lens portion 18 and covering the recognition target portion 19, is formed. The method of forming the light transmissive member is similar to that of the manufacturing method according to the first embodiment, and therefore its description is omitted.

First Example

Next, a light-emitting device according to a first example will be described. The light-emitting device according to the first example is one example of the light-emitting device 100 according to the first embodiment, and aluminum nitride is used for the support body 11, and Au (gold) is used for the recognition target portion 19, and titanium oxide is used for the insulation layer 15. In the light-emitting device according to the first example, when it is assumed that the peak wavelength of the light emitted to the support body 11 and the insulation layer 15 during performing visual recognition or digital recognition is 450 nm, the reflectivity of aluminum nitride at the peak wavelength is 10 to 40%, and the reflectivity of Au is 30 to 60%, and the reflectivity of titanium oxide is 80 to 98%. Accordingly, in the light-emitting device according to the first example, the reflectivity of the recognition target portion 19 may become lower than the reflectivity of the support body 11. Therefore, it is not always easy to recognize the recognition target portion 19 itself. On the other hand, the reflectivity of the insulation layer 15 is always higher than the reflectivity of the support body 11 in the first example, so that the position of the recognition target portion 19 can be recognized by recognizing the position of the insulation layer 15. Accordingly, even in a case where a difference in reflectivity between the support body and the wiring patterns is small, various kinds of processing with visual recognitions or digital recognitions such as inspection, mounting and division can be smoothly performed through the use of the insulation layer that covers the recognition target portion. Therefore, it is possible to select combinations of the support body and the wiring patterns in which the difference in reflectivity between the support body and the wiring patterns is small while other aspect such as heat-dissipation and sulfur resistance is good. It is noted that the reflectivity of titanium oxide is higher than the reflectivity of Au (reflectivity with respect to the peak wavelength of the light emitted from the light-emitting element 14. Herein, the peak wavelength of the light is assumed to be 450 nm, as is the same with the peak wavelength of the light emitted to the support body 11 and the insulation layer 15 during performing visual recognition or digital recognition), so that the reflectivity of the insulation layer 15 is higher than the reflectivity of the recognition target portion 19 in the light-emitting device according to the first example.

The embodiments described above are merely described as examples, and the present invention is not limited to them.

What is claimed is:

1. A light-emitting device, comprising:
a support body having a quadrangle planar shape;
a wiring pattern on the support body;
a light-emitting element on the wiring pattern;
a recognition target portion on a corner portion of a plan view of the support body, the recognition target portion comprising a conductive material;
an insulation layer reflecting light emitted from the light-emitting element and covering at least a periphery of the recognition target portion; and
a light transmissive member that includes a lens portion covering the light-emitting element, and a flange portion arranged on a periphery of the lens portion and covering at least a part of the recognition target portion that is covered with the insulation layer,
wherein the recognition target portion is arranged so that the portion of the recognition target portion covered by the flange portion is arranged in a non-point symmetry around a center of the support body,
wherein a difference in reflectivity between the support body and the insulation layer is larger than a difference in reflectivity between the support body and the recognition target portion, and wherein a length of the recognition target portion from a periphery of the lens portion an outermost edge of the recognition target portion is 0.3 mm or more.

2. The light-emitting device according to claim 1, wherein the recognition target portion is a part of the wiring pattern.

3. The light-emitting device according to claim 1, wherein an entirety of the recognition target portion is covered with the insulation layer.

4. The light-emitting device according to claim 1, further comprising a phosphor layer covering the light-emitting element.

5. The light-emitting device according to claim 1, further comprising a phosphor layer covering the recognition target portion and a portion of the wiring pattern located laterally outside a periphery of the light-emitting element in a plan view.

6. The light-emitting device according to claim 5, wherein the phosphor layer is covered with the insulation layer.

7. The light-emitting device according to claim 1, wherein the insulation layer comprises at least one of the group of: titanium dioxide, silicon dioxide, zirconia, potassium titanate, alumina, aluminum nitride, boron nitride, mullite, niobium oxide, zinc oxide, barium sulfate, and rare earth oxides.

8. The light-emitting device according to claim 1, wherein the support body comprises at least one of the group of: alumina, aluminum nitride, mullite, glass epoxy, and epoxy resin.

9. The light-emitting device according to claim 1, further comprising a protective element disposed on the wiring pattern, wherein the protective element is covered with the insulation layer.

10. The light-emitting device according to claim 1, wherein a difference in reflectivity between the support body and the insulation layer is 30% or more.

11. The light-emitting device according to claim 1, wherein the support body has a rectangular shape.

12. A light-emitting device, comprising:
a support body;
a wiring pattern on the support body;
a light-emitting element on the wiring pattern;
a recognition target portion on a corner portion of the support body, the recognition target portion comprising a conductive material;
a phosphor layer covering the recognition target portion and a portion of the wiring pattern located laterally outside a periphery of the light-emitting element in a plan view;
an insulation layer reflecting light emitted from the light-emitting element and covering a periphery of the recognition target portion that is covered with the phosphor layer; and
a light transmissive member that includes a lens portion covering the light-emitting element, and a flange portion arranged on a periphery of the lens portion and covering at least the part of the recognition target portion that is covered with the phosphor and the insulation layer,
wherein a difference in reflectivity between the support body and the insulation layer is larger than a difference in reflectivity between the support body and the recognition target portion, and
wherein a distance of the recognition target portion from a periphery of the lens portion, in the direction from the lens portion to the flange portion, is 0.3 mm or more.

13. The light-emitting device according to claim 12, wherein the recognition target portion is arranged so that the portion of the recognition portion covered by the flange portion is arranged in a non-point symmetry around a center of the support body.

14. The light-emitting device according to claim 12, wherein the recognition target portion is a part of the wiring pattern.

15. The light-emitting device according to claim 12 further comprising a protective element on the wiring pattern, wherein the protective element is covered by the insulation layer.

16. The light-emitting device according to claim 12, wherein a difference in reflectivity between the support body and the insulation layer is 30% or more.

17. The light-emitting device according to claim 12, wherein the support body has a rectangular shape.

* * * * *